United States Patent
Muramatsu

[11] Patent Number: 6,011,300
[45] Date of Patent: Jan. 4, 2000

[54] SEMICONDUCTOR INTEGRATED CIRCUIT DEVICE

[75] Inventor: Shigetsugu Muramatsu, Nagano, Japan

[73] Assignee: Shinko Electric Industries Co., Ltd., Nagano, Japan

[21] Appl. No.: 08/919,047

[22] Filed: Aug. 27, 1997

Related U.S. Application Data

[63] Continuation of application No. 08/647,282, May 13, 1996, abandoned, which is a continuation of application No. 08/394,871, Feb. 27, 1995, abandoned.

[30] Foreign Application Priority Data

Mar. 1, 1994 [JP] Japan ...................................... 6-031059

[51] Int. Cl.[7] .................................................. H01L 23/495
[52] U.S. Cl. .......................... 257/668; 257/676; 257/692; 257/737; 257/787
[58] Field of Search ...................................... 257/668, 676, 257/692, 698, 734, 737, 774, 778, 780, 787

[56] References Cited

U.S. PATENT DOCUMENTS

| | | | |
|---|---|---|---|
| 3,289,046 | 11/1966 | Carr | 257/778 |
| 3,868,724 | 2/1975 | Perrino | 357/65 |
| 4,246,595 | 1/1981 | Noyori . | |
| 4,336,551 | 6/1982 | Fujita et al. | 257/778 |
| 4,356,374 | 10/1982 | Noyori | 219/121 |
| 5,083,191 | 1/1992 | Ueda | 357/68 |
| 5,130,793 | 7/1992 | McLellan . | |

FOREIGN PATENT DOCUMENTS

| | | |
|---|---|---|
| 0 212 994 | 8/1985 | European Pat. Off. . |
| 502710 | 3/1992 | European Pat. Off. . |
| 514637 | 11/1992 | European Pat. Off. . |
| 2810054 | 3/1978 | Germany . |
| 1-206651 | 8/1989 | Japan . |

*Primary Examiner*—Carl Whitehead, Jr.
*Attorney, Agent, or Firm*—Pennie & Edmonds LLP

[57] ABSTRACT

A semiconductor integrated circuit device includes: a base film made of insulating material; a wiring pattern of a predetermined shape formed on the base film; a semiconductor chip provided on the base film, wherein an electrode terminal of the semiconductor chip comes into contact with one end of the wiring pattern; and a flexible protective film having an insulating property, the flexible protective film being adhered onto the base film while it covers the semiconductor chip and one end of the wiring pattern.

6 Claims, 7 Drawing Sheets

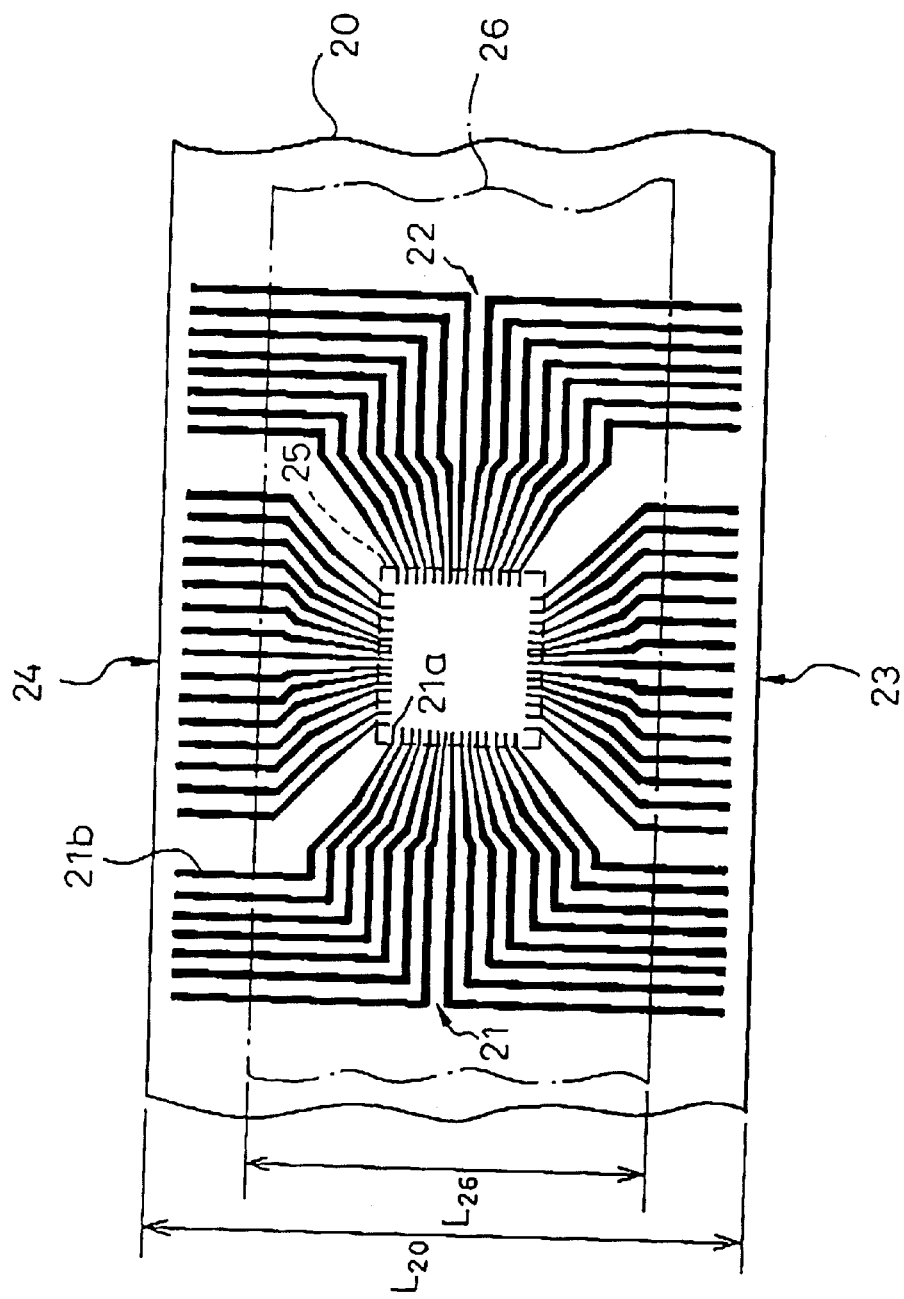

SEMICONDUCTOR INTEGRATED CIRCUIT DEVICE

This is a continuation of application No. 08/647,282, filed May 13, 1996, now abandoned, which in turn is a continuation of 08/394,871, filed Feb. 27, 1995, now abandoned.

BACKGROUND OF THE INVENTION

1. Field of the Invention

The present invention relates to a semiconductor integrated circuit device, and more particularly relates to a semiconductor integrated circuit device on which a chip operation test can be easily carried out on a bare chip.

2. Description of the Related Art

In general, a bare chip, that is, a semiconductor chip that has been cut out from a wafer, is permanently packaged with a plastic or ceramic film and subjected to a screening test that is an initial inspection test through which defective articles are screened out. Only articles that have passed the test, that is, only articles, with assured quality, are shipped. However, a multi-chip-module (referred to as "MCM" hereinafter) has entered the market recently, and the demand has expanded rapidly. In accordance with the expansion of the demand, it is desired to assure quality of bare semiconductor chips.

In this case, MCM is an assembling technique by which the delay of a signal transmission between packages can be avoided when a plurality of semiconductor chips of ICs or LSIs are directly provided on a highly dense wiring board, so that the characteristics of the chips can be fully utilized. Therefore, MCM is a promising technique superior to the prior art, in which the manufacturing characteristics of silicon are better utilized, and system performance can be enhanced.

The conventional test on a semiconductor chip is carried out in the following manner: A probe for inspection use is contacted with the electrode terminal of a semiconductor chip. Alternatively, the test can be made after the semiconductor chip has been assembled into a semiconductor package.

In this connection, as described above, in the case of an MCM in which a plurality of semiconductor chips is provided on one base board, the yield of the MCM is directly affected by the quality of each chip. Therefore, it is required to carry out the quality assurance test under the condition of a semiconductor chip, and a quality check test is performed using a socket used exclusively for the semiconductor chip, wherein this socket is temporarily used only for the test. However, the size of the electrode terminal and the interval between the electrode terminals of the semiconductor chip are very minute. Therefore, it is difficult to accurately match the terminal size and interval of the exclusive socket to those of the semiconductor chip. Therefore, the cost of developing the exclusive socket is increased.

When the screening test is performed on a semiconductor chip, the semiconductor chip tends to be damaged by external factors such as static electricity when it is conveyed or packaged. For this reason, the reliability of quality assurance deteriorates.

SUMMARY OF THE INVENTION

Consequently, it is an object of the present invention to provide a new semiconductor integrated circuit device characterized in that: the integrated circuit is easily contacted with the electrode terminal of a semiconductor chip; the semiconductor chip is less susceptible to damage caused by external factors when the semiconductor chip is conveyed or packaged, so that the reliability of quality assurance can be enhanced; and the semiconductor chip can be easily removed from the circuit device.

According to the present invention, there is provided a semiconductor integrated circuit device comprising: a base film made of insulating material; a wiring pattern of a predetermined shape formed on the base film; a semiconductor chip provided on the base film, wherein electrode terminals of the semiconductor chip come into contact with one ends of the wiring pattern; and a flexible protective film having an insulating property, the flexible protective film being adhered onto the base film while it covers the semiconductor chip and the one ends of the wiring pattern.

The semiconductor chip is completely covered with the base film and protective film. Therefore, the semiconductor chip can be protected from damage caused by external factors such as static electricity when it is conveyed or packaged. The terminal size and interval of the exclusive socket for use in the screening test may be made to coincide with the pattern width and the pattern interval on the other side of the wiring pattern. Such a pattern width and pattern interval can be freely designed, so that the exclusive socket can be commonly used for different semiconductor chips. Accordingly, the cost of developing the exclusive socket can be reduced.

According to another aspect of the present invention, there is provided a semiconductor integrated circuit device comprising: a base film made of insulating material; a wiring pattern of a predetermined shape formed on a side of the base film opposite to the side on which a semiconductor chip is provided, wherein one ends of the wiring pattern penetrate through the base film so as to be exposed onto the surface of the base film on which the semiconductor chip is to be provided; the semiconductor chip provided on the base film, wherein electrode terminals of the semiconductor chip come into contact with one ends of the wiring pattern; and a flexible protective film having an insulating property, wherein the flexible protective film is adhered onto the base film, covering at least the overall semiconductor chip.

In this aspect, in addition to the above, the wiring pattern is provided on a reverse side of the base film, that is, the wiring pattern is provided on the side opposite to the side onto which the protective film is adhered. Therefore, the exposing process for exposing the wiring pattern to make it come into contact with the terminals of the exclusive socket for use in the screening test is not necessary, that is, the peeling work for partially peeling off the protective film so as to expose the wiring pattern from the protective film is not necessary. Therefore, it is possible to reduce the cost.

BRIEF DESCRIPTION OF THE DRAWINGS

FIG. 5 is a perspective plan view of the third embodiment;

DESCRIPTION OF THE EMBODIMENTS

With reference to the accompanying drawings, the most preferred embodiments of the present invention will be explained as follows.

FIRST EXAMPLE

Figure 1A:
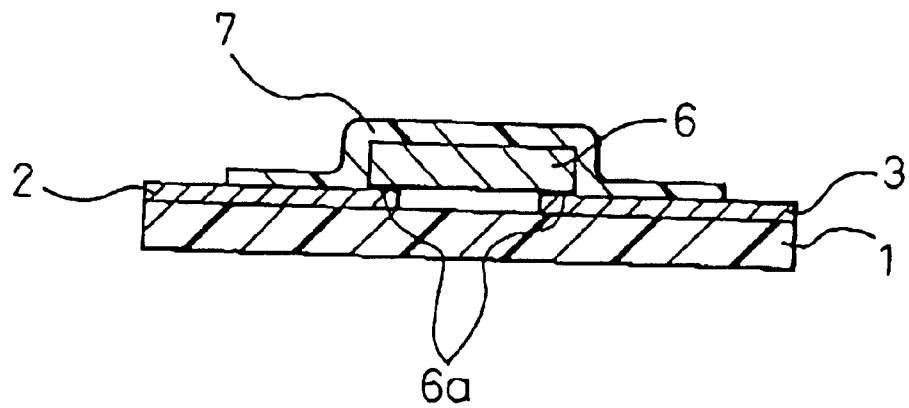
FIGS. 1(*a*) and 1(*b*) are cross-sectional and plan views of the first embodiment of the present invention.
Figure 1B:
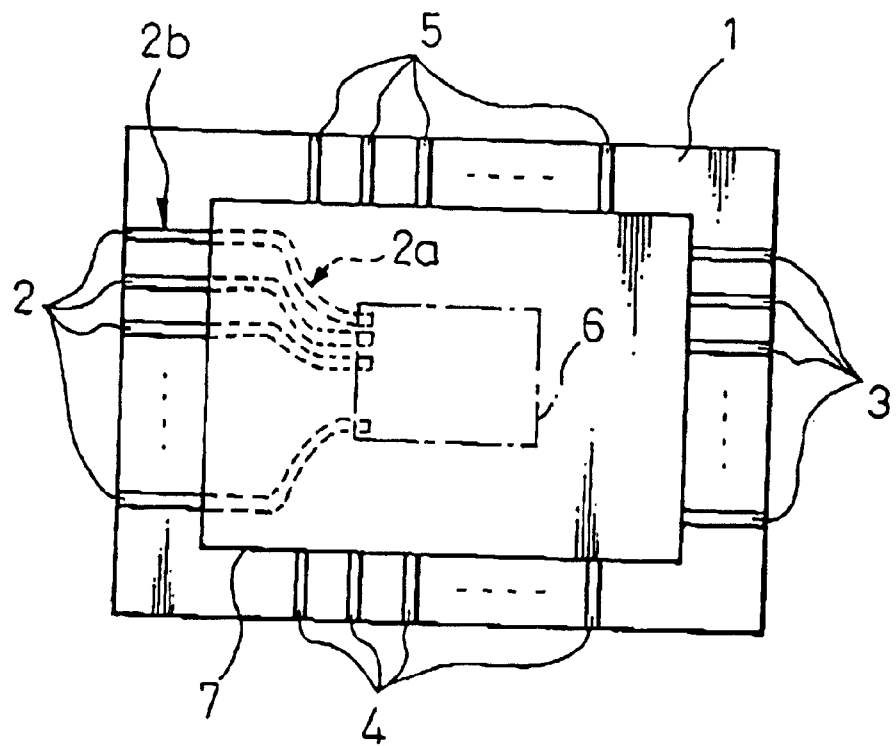

FIG. 1(a) and 1(b), 2(a) through 2(d), and 3 are views showing the first embodiment of the semiconductor integrated circuit device of the present invention. First, the construction of this embodiment will be described below. In FIGS. 1(a) and 1(b) numeral 1 is a base film. For example, insulating materials such as polyester, polypropylene or polyimide are used for the base film 1.

On the base film 1, wiring patterns 2 to 5 are formed from copper foil by means of etching, electrically conductive paste (made of Au, Ag, Cu and Ni, or solder), plating, vapor-depositing or spattering. Concerning the configuration of the pattern, as a typical example is shown by the wiring pattern 2, the pattern is designed in the following manner: The pattern width and pattern interval on one side 2a are made to coincide with the size and interval of the electrode terminals 6a, preferably "bumps" of the conductor chip 6. Further, the pattern width and pattern interval on the other side 2b are made to be as large as possible. Furthermore, the pattern width and pattern interval on the other side 2b are made to coincide with the terminal size and terminal interval of an exclusive socket used for the screening test.

A protective film 7 is adhered onto the base film 1 so that the protective film 7 covers the overall semiconductor chip 6 and also covers the portions of the wiring patterns 2 to 5 on one side, that is, the other portions of the wiring patterns 2 to 5 are exposed. For example, insulating and flexible materials such as polyester, polypropylene or PET (polyethylene terephthalate) are used for the protective film 7.

Figure 2A:
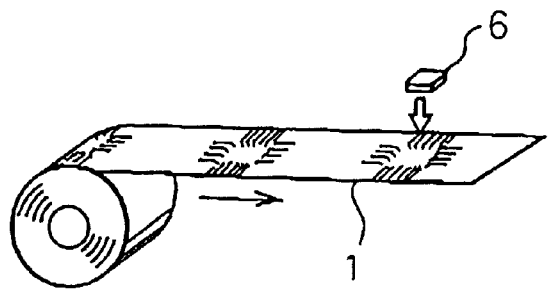
FIGS. 2(*a*) through 2(*d*) show a manufacturing process of the first embodiment shown in FIGS. 1(*a*) and 1(*b*)

Next, the manufacturing process of this example will be explained as follows. As illustrated in FIG. 2(a), the tape-shaped base film 1 wound around a drum is fed to a predetermined position. In this case, the wiring patterns are formed on the base film 1 at regular intervals. Then, a surface on which the electrode terminals 6aof the semiconductor chip 6 are formed is opposed to a surface of the base film 1 on which the wiring patterns 2 to 5 are formed. After that, the semiconductor chip 6 is placed on the base film 1 while the electrode terminals of the semiconductor chip 6 are positioned onto one ends of the wiring patterns 2 to 5. Such an operation can be carried out by means of a robot hand (not shown).

Figure 2B:
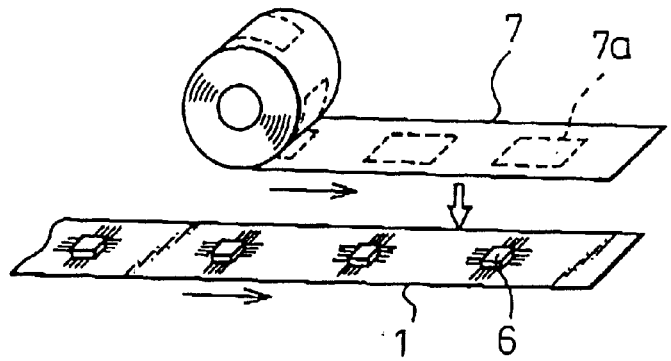

Next, as illustrated in FIG. 2(b), the tape-shaped protective film 7 wound around a drum is fed by a predetermined length and set along the surface on which the semiconductor chip is provided. After that, the protective film 7 is adhered onto the surface by means of vacuum adsorption. In this case, perforations 7a are previously formed on the protective film 7 at regular intervals, and an area enclosed by the perforations 7a is the same as the final size of the protective film 7. As a means of vacuum adsorption, it is possible to suck air which exists between the base film 1 and the protective film 7. However, it is preferable that the entire work is carried out in a vacuum chamber because the work can be simplified.

Figure 2C:
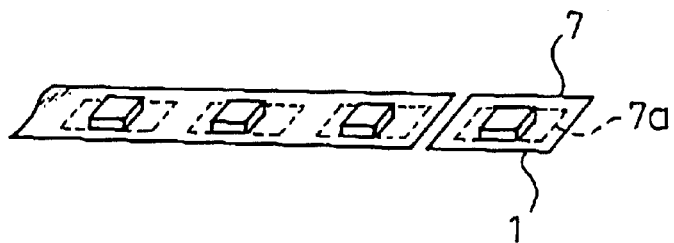
Figure 2D:
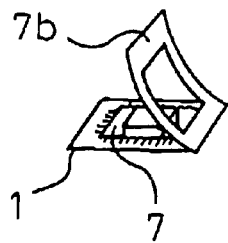
Figure 3:
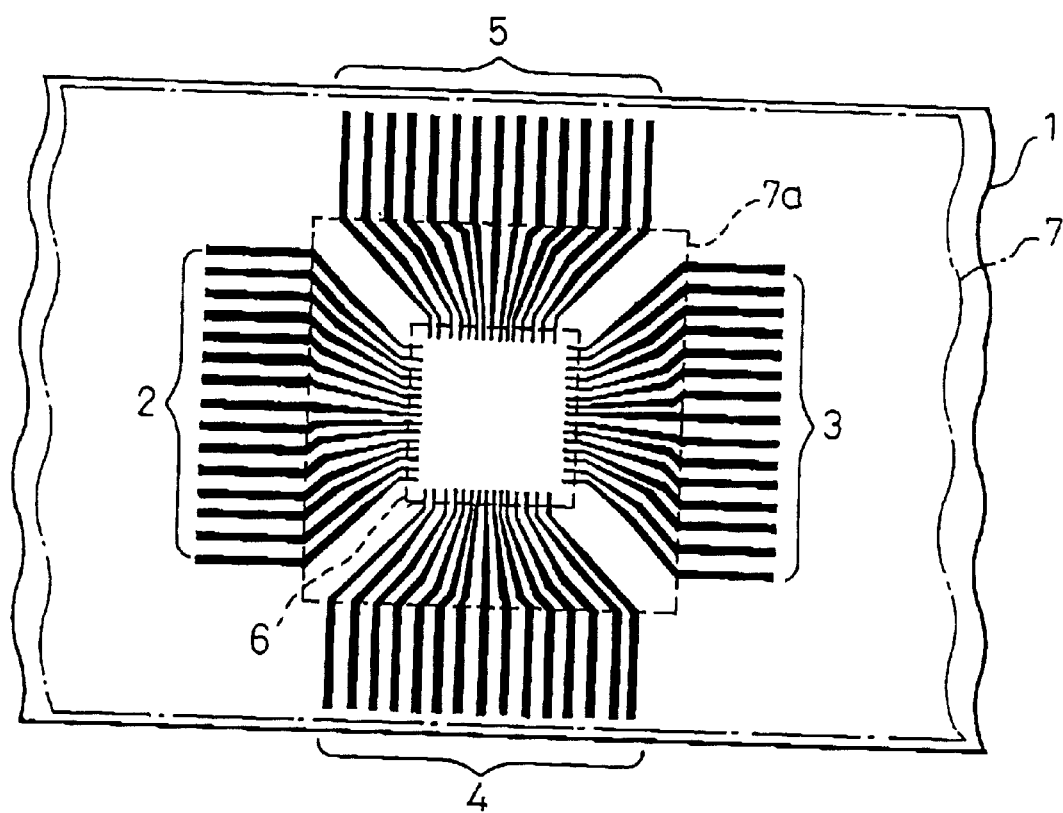
FIG. 3 is a perspective plan view of the first embodiment.

After the adhesion process of the base film 1 and the protective film 7 has been completed, as illustrated in FIG. 2(c), both the base film 1 and the protective film 7 are cut by a predetermined length. Finally, as illustrated in FIG. 2(d), an unnecessary portion 7b of the protective film 7 is removed along the perforations 7a formed on the protective film 7. In this way, the construction illustrated in FIG. 1 is completed.

According to the semiconductor integrated circuit having the structure described above, as illustrated in FIG. 3, the semiconductor chip 6 is interposed between the base film 1 and the protective film 7. To be more accurate, the semiconductor chip 6 is interposed between the base film 1 and the protective film 7 enclosed by the perforations 7a. Accordingly, the entire semiconductor chip 6 is completely covered while the outside air is shut off. Therefore, for example, in the processes of screening test, conveyance and packaging, the semiconductor chip 6 is not damaged by external factors such as static electricity.

It is possible to arbitrarily design the pattern width and the pattern interval of the wiring patterns 2 to 5 on the other side. Accordingly, when these values are appropriately designed, it is possible to realize an exclusive socket used for the screening test that can be commonly used with respect to various sizes. When the other side of the wiring patterns 2 to 5 is made to be common irrespective of the type of the semiconductor chip, it is possible to apply one type of exclusive socket to various types of semiconductor chips.

Since the base film 1 and the protective film 7 are only closely contacted to each other by means of vacuum-adsorption, when air is introduced between the base film 1 and the protective film 7 by inserting a finger nail or similar object into a gap between the base film 1 and the protective film 7, both films 1 and 7 are easily separated from each other, and the semiconductor chip can be easily picked up.

SECOND EXAMPLE

Figure 4A:
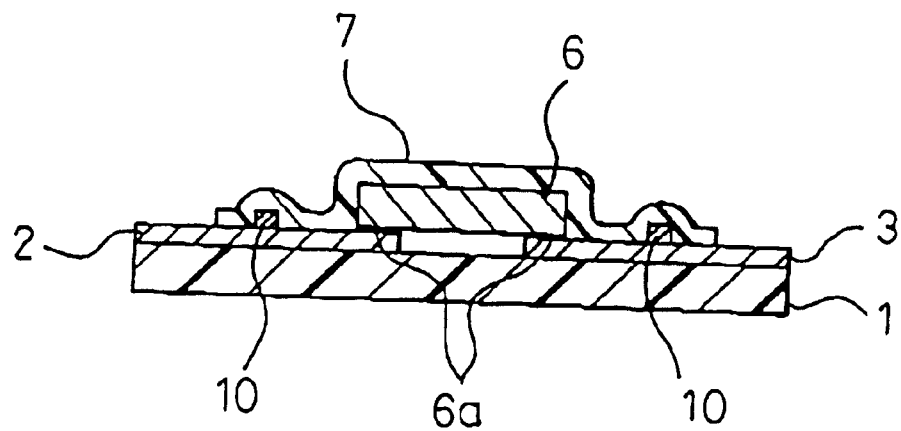
FIGS. 4(*a*) and 4(*b*) are cross-sectional and plan views of the second embodiment of the present invention.
Figure 4B:
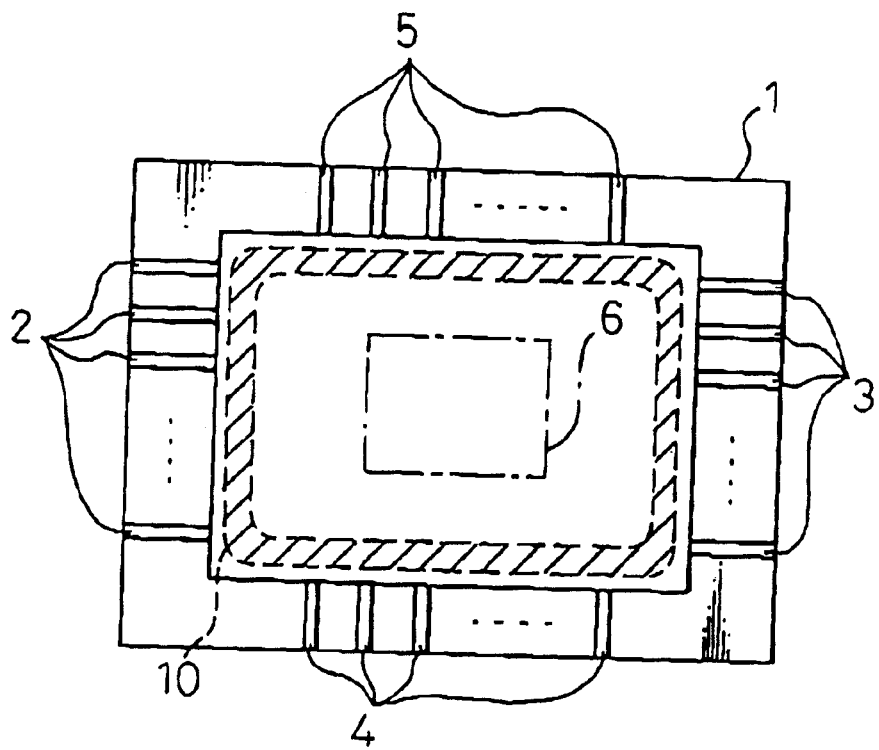

FIGS. 4(a) and 4(b) are views showing the second example of the semiconductor circuit device of the present invention. In addition to the structure of the first example described above, the second example is constructed in such a manner that the base film 1 and the protective film 7 are partially adhered to each other by an adhesive agent. In this case, the adhesive agent loses its adhesive force when it is subjected to the after-treatment. In this connection, like reference characters are used to indicate like parts in the first and second examples.

In this example, numeral 10 denotes a thermal separation type adhesive agent, which is a polyurethane type adhesive agent, the adhesive force of which is lost when it is heated. Also, numeral 10 denotes a UV hardening type adhesive agent, the adhesive force of which is lost when it is exposed to ultraviolet rays, for example, a base material made of polyester, polyurethane or epoxy, and a photosensitive group such as an acryloyl group or a diazo group is contained therein. The adhesive agent 10 is coated along a line surrounding the semiconductor chip 6, and the width of the coated zone is very minute. The coated zone is a hatched portion in the drawing. Due to the foregoing, the base film 1 and the protective film 7 are positively adhered to each other over a long period of time. Especially when the semiconductor chip is stored over a long period of time, the semiconductor chip 6 is not affected by the moisture contained in the outside air, so that the deterioration of the semiconductor chip can be avoided. In the case where the semiconductor chip 6 is picked up, after heat has been applied to the adhesive portion and ultraviolet rays have been irradiated upon it, the base film 1 and the protective film 7 may be separated from each other with a finger nail.

Instead of applying the adhesive agent, the base film 1 and the protective film 7 may be thermally adhered with pressure along a line to be adhered, that is, thermo-compression adhesion may be applied. When the adhesive agent is used, or when the base film 1 and the protective film 7 are subjected to thermo-compression adhesion, the vacuum adsorption method is not necessarily used. In the case where the vacuum adsorption method is not used, an inert gas such as $N_2$ gas may be enclosed between the base film 1 and the protective film 7.

THIRD EXAMPLE

FIG. 5 is a view showing the third example of the semiconductor circuit device of the present invention. In this example, it is not necessary to provide perforations on the protective film, and it is not necessary either to provide a process in which the extra portion of the protective film is removed. The process in which an extra portion of the protective film is removed is illustrated in FIG. 2(*d*).

In FIG. 5, numeral 20 is a base film, and wiring patterns 21 to 24 are formed on the base film 20. The patterns are designed in the following manner: The width and interval of the pattern on one side, which is represented by reference numeral 21*a* in FIG. 5, are made to coincide with the size and interval of electrode terminals (reference numeral 6*a* in FIG. 1) of the semiconductor chip 25. At the same time, the width and interval of the pattern on the other side are made to be as wide as possible, or alternatively the width and interval of the pattern on the other side are made to be the same as those of the exclusive socket used for the screening test not illustrated in the drawing. Further, all the terminals on the other side 21*b* are arranged at an end of the base film 20 in the lateral direction.

Numeral 26 is a protective film adhered onto the base film 20 in such a manner that at least all the semiconductor chip 25 is covered with the protective film 26. The width $L_{26}$ of the protective film 26 in the lateral direction is determined to be shorted than the width $L_{20}$ of the base film 20 in the lateral direction.

Preferable materials used for each component of this example are the same as those having the same names in the first example. In this example, the base film 20 and the protective film 26 are adhered to each other by the vacuum adsorption method, the adhesion method or the thermo-compression adhesion method. These methods may be singly applied, or alternatively they may be combined with each other.

According to the above structure, at a point of time when the base film 20 and the protective film 26 are adhered to each other, all the terminals of the wiring patterns 21 to 24 on the other side 21*b* are exposed. Therefore, unlike the first example, it is not necessary to provide perforations on the protective film and to peel off an extra portion of the protective film. Accordingly, the cost can be further reduced.

FOURTH EXAMPLE

Figure 6:
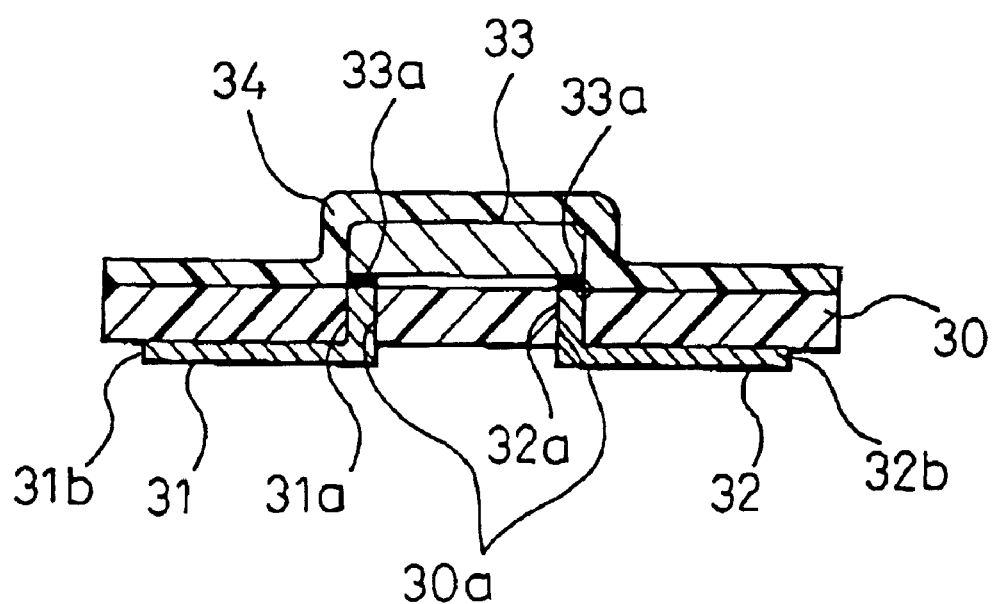
FIG. 6 is a cross-sectional view of the fourth embodiment.

FIG. 6 is a view showing the fourth example of the semiconductor circuit device of the present invention. In this example, the wiring pattern is formed on a reverse side of the base film.

In FIG. 6, numeral 30 is a base film. On the bottom side (reverse side) of the base film 30, wiring patterns 31, 32 are provided. The patterns are designed in the following manner: The width and interval of the pattern on one side 31*a*, 32*a* are made to coincide with the size and interval of electrode terminals 33*a* of the semiconductor chip 33. At the same time, the width and interval of the pattern on the other side 31*b*, 32*b* are made to be as wide as possible, or alternatively the width and interval of the pattern on the other side are made to be the same as those of the exclusive socket used for the screening test not illustrated in the drawing. Terminals on one side 31*a*, 32*a* penetrate through the base film 30 and are exposed onto an upper surface of the base film 30 (a surface on which the semiconductor chip 30 is placed) through a via 30*a*.

Numeral 34 is a protective film adhered onto the base film 30 in such a manner that the entire semiconductor chip 33 is covered with the protective film.

Preferable materials used for the components of this example are the same as those having the same names in the first example. In this example, the base film 30 and the protective film 34 are adhered to each other by the vacuum adsorption method, the adhesion method or the thermo-compression adhesion method. These methods may be singly applied, or alternatively they may be combined with each other.

According to the above structure, the wiring patterns 31, 32 are formed on a reverse surface (a surface opposite to the surface on which the semiconductor chip 33 is placed). Therefore, unlike the first example, it is not necessary to provide perforations on the protective film and to peel off an extra portion of the protective film in this example. Further, unlike the third example, it is not necessary to give consideration to the widths ($L_{26}$, $L_{20}$) of the base film and the protective film. Accordingly, the cost can be further reduced.

In this connection, in all examples described above, it is preferable that the semiconductor chip and the base film are temporarily fastened to each other with an adhesive agent when the semiconductor chip is assembled onto the base film. In this case, the adhesive agent loses its adhesive force in the after-treatment. In this case, the thermal separation type adhesive agent and the UV hardening type adhesive agent, which are used in the second example, may be also used. Due to the foregoing, positioning accuracy of the semiconductor can be enhanced, and further, it is possible to avoid the deviation of the position of the semiconductor chip while the semiconductor chip is not covered with the protective film.

FIFTH AND SIXTH EXAMPLES

Figure 7:
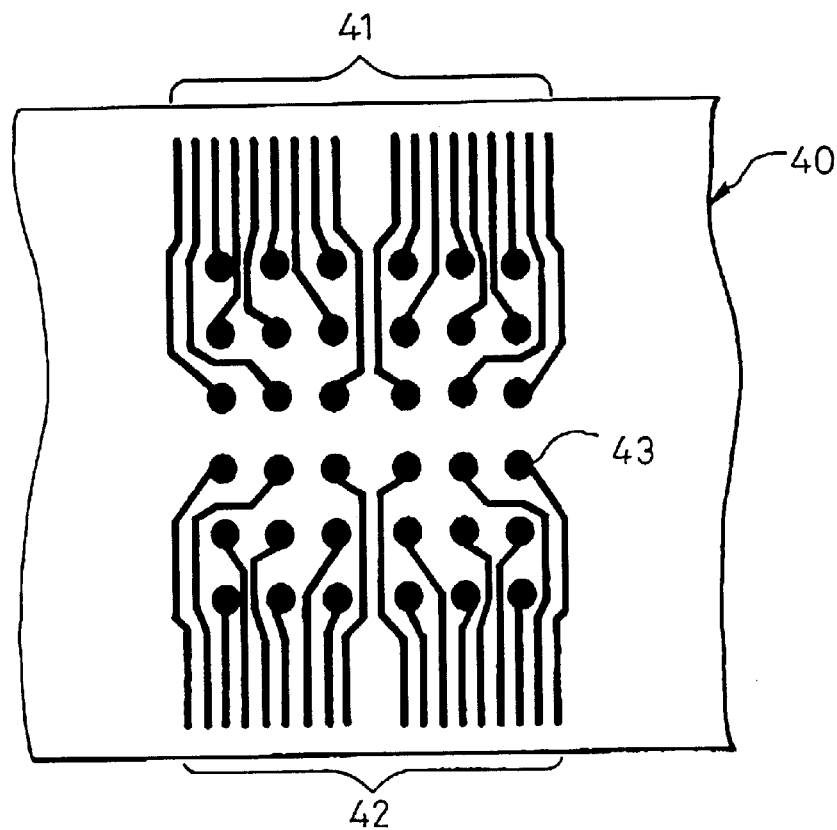
FIGS. 7 and 8 are plan views of the fifth and sixth embodiment of this invention.
Figure 8:
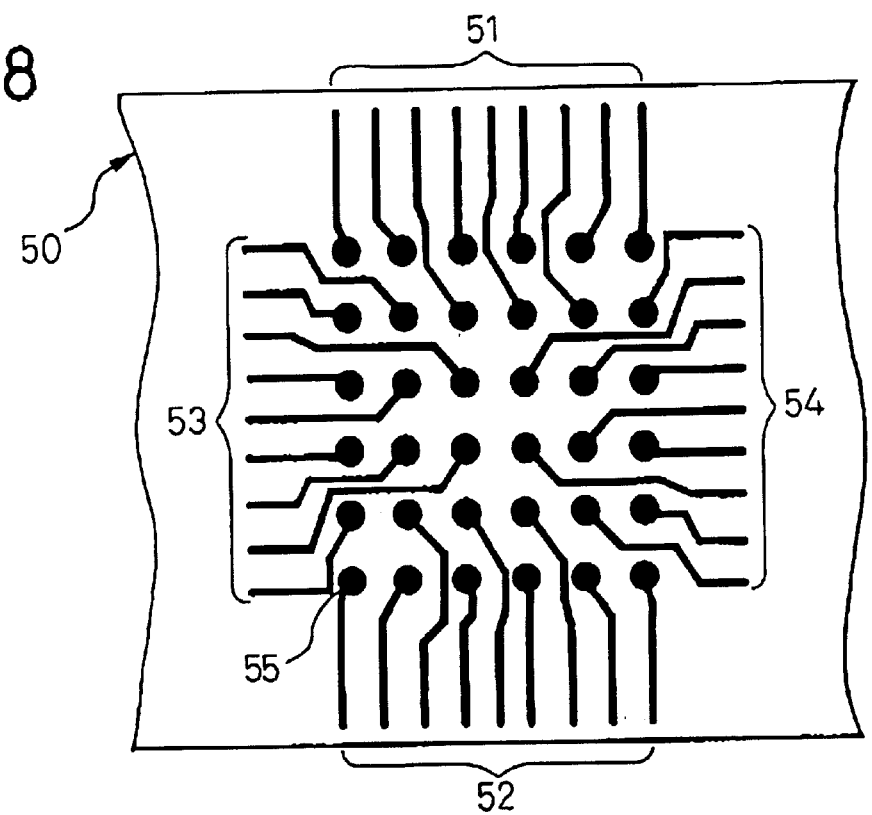

FIGS. 7 and 8 are views showing the fifth and sixth examples of the base film providing with wiring patterns in a semiconductor circuit device of the present invention.

These examples can be advantageously used if the plurality of electrode terminals of the semiconductor chip (not shown in FIGS. 7 and 8) are arranged in a land grid array.

In FIG. 7, numeral 40 is a base film, and wiring patterns 41 and 42 are formed on the base film 40. Each of the wiring patterns 41 and 42 is provided at the inner end thereof with a conductive land portion 43. The land portion 43 are also arranged in a land grid array to coincide with the respective electrode terminals of the semiconductor chip.

The width and interval of the patterns 41 and 42 on the other side are made to be the same as those of the exclusive socket used for the screening test (not illustrated in the drawing), in the same manner as the embodiment shown in FIG. 5.

In FIG. 8, numeral 50 is a base film, and wiring patterns 51 to 54 are formed on the base film 50. In the same manner as the embodiment of FIG. 7, each of the wiring patterns 51 to 54 is provided at the inner end thereof with a conductive land portion 55. The land portions 55 are also arranged in a land grid array to coincide with the respective electrode terminals of the semiconductor chip. The width and interval of the patterns 51 to 54 on the other side are made to be the same as the embodiment shown in FIG. 3.

I claim:

1. A semiconductor integrated circuit device adapted to be used for testing performance of a semiconductor chip, said device comprising: a base film made of insulating material; a wiring pattern of a predetermined shape formed on said base film and having a chip connecting region; a semiconductor chip provided on said base film and having electrode terminals in contact with the chip-connecting region of said wiring pattern; and a flexible protective film having an insulating property which adheres to said base film, covers said semiconductor chip and said chip-connecting region of the wiring pattern, and maintains a vacuum in order to hold said semiconductor chip in electrical contact with the wiring pattern.

2. A semiconductor integrated circuit device adapted to be used for testing performance of a semiconductor chip, said device comprising: a base film made of insulating material having two opposing planar sides, said film having a chip connecting region; a wiring pattern of a predetermined shape formed on the first side of said base film, wherein the chip-connecting region of said wiring pattern penetrates through said base film so as to be exposed to the second side of said base film; a semiconductor chip provided on the second side of said base film and having electrode terminals in contact with said chip-connecting region of said wiring pattern; and a flexible protective film having an insulating property, wherein said flexible protective film is adhered onto said base film such that said flexible protective film covers at least the overall semiconductor chip and maintains a vacuum in order to hold said semiconductor chip in electrical contact with the wiring pattern.

3. The device of claim 1 which further comprises an adhesive disposed substantially surrounding the perimeter of said semiconductor chip to cover said semiconductor chip and said chip-connecting region of said wiring pattern to hold said semiconductor chip in electrical contact with said wiring pattern.

4. The device of claim 1 which further comprises a thermo-compression region substantially surrounding the perimeter of said semiconductor chip to cover said semiconductor chip and said chip-connecting region of said wiring pattern to hold said semiconductor chip in electrical contact with said wiring pattern.

5. The device of claim 2 which further comprises an adhesive disposed substantially surrounding the perimeter of said semiconductor chip to cover said semiconductor chip and said chip-connecting region of said wiring pattern to hold said semiconductor chip in electrical contact with said wiring pattern.

6. The device of claim 2 which further comprises a thermo-compression region substantially surrounding the perimeter of said semiconductor chip to cover said semiconductor chip and said chip-connecting region of said wiring pattern to hold said semiconductor chip in electrical contact with said wiring pattern.

\* \* \* \* \*